United States Patent
Chung

(10) Patent No.: US 8,988,406 B2
(45) Date of Patent: Mar. 24, 2015

(54) SCAN DRIVER AND ORGANIC LIGHT EMITTING DISPLAY USING THE SCAN DRIVER

(75) Inventor: Kyung-Hoon Chung, Yongin (KR)

(73) Assignee: Samsung Display Co., Ltd., Yongin-si (KR)

(*) Notice: Subject to any disclaimer, the term of this patent is extended or adjusted under 35 U.S.C. 154(b) by 1182 days.

(21) Appl. No.: 12/904,976

(22) Filed: Oct. 14, 2010

(65) Prior Publication Data

US 2011/0227884 A1  Sep. 22, 2011

(30) Foreign Application Priority Data

Mar. 16, 2010  (KR) .................. 10-2010-0023401

(51) Int. Cl.
G09G 5/00 (2006.01)
G09G 3/32 (2006.01)
G11C 19/18 (2006.01)
G11C 19/28 (2006.01)

(52) U.S. Cl.
CPC ............ *G09G 3/3266* (2013.01); *G11C 19/184* (2013.01); *G11C 19/28* (2013.01); *G09G 2310/0286* (2013.01); *G09G 2310/06* (2013.01)
USPC ......................................... 345/208

(58) Field of Classification Search
USPC ............................ 345/76, 100, 208
See application file for complete search history.

(56) References Cited

U.S. PATENT DOCUMENTS

| 6,107,978 | A | 8/2000 | Nagaoka et al. | |
| 6,426,743 | B1 * | 7/2002 | Yeo et al. | 345/213 |
| 2003/0128180 | A1 * | 7/2003 | Kim et al. | 345/100 |
| 2004/0227718 | A1 * | 11/2004 | Park | 345/100 |
| 2005/0156856 | A1 * | 7/2005 | Jang et al. | 345/100 |
| 2007/0040771 | A1 | 2/2007 | Chung et al. | |
| 2007/0063933 | A1 | 3/2007 | Chung | |
| 2007/0063950 | A1 * | 3/2007 | Shin | 345/92 |
| 2007/0124633 | A1 | 5/2007 | Kim | |
| 2007/0242000 | A1 * | 10/2007 | Shin | 345/76 |
| 2008/0224985 | A1 * | 9/2008 | Jang | 345/100 |

FOREIGN PATENT DOCUMENTS

| JP | 3408684 | 5/2003 |
| JP | 2009-63881 | 3/2009 |
| KR | 10-0646992 | 11/2006 |
| KR | 10-0714003 | 5/2007 |
| KR | 10-0732836 | 6/2007 |
| KR | 10-2007-0103183 A | 10/2007 |
| KR | 10-0806814 | 2/2008 |

OTHER PUBLICATIONS

Registration Determination Certificate dated Dec. 1, 2011 issued in Korean Priority Application No. 10-2010-0023401, 5 pages.

* cited by examiner

*Primary Examiner* — Jonathan Boyd
(74) *Attorney, Agent, or Firm* — Christie, Parker & Hale, LLP

(57) ABSTRACT

A scan driver is coupled to a plurality of scan lines and includes a plurality of stages. Each of the stages is configured to sequentially receives clock signals that are phase delayed by two horizontal cycles or more from three of a plurality of clock lines, and output a scan signal having a pulse width of two horizontal cycles or more to a corresponding scan line. The scan signals are overlapped with each other by one horizontal cycle or more.

13 Claims, 7 Drawing Sheets

SCAN DRIVER AND ORGANIC LIGHT EMITTING DISPLAY USING THE SCAN DRIVER

CROSS-REFERENCE TO RELATED PATENT APPLICATIONS

This application claims priority to and the benefit of Korean Patent Application No. 10-2010-0023401, filed on Mar. 16, 2010, in the Korean Intellectual Property Office, the disclosure of which is incorporated herein in its entirety by reference.

BACKGROUND

1. Field

Aspects of embodiments of the present invention relate to a scan driver and an organic light emitting display using the scan driver.

2. Description of the Related Art

Organic light emitting displays may be used as display devices for personal computers, mobile phones, and portable information terminals such as personal digital assistants (PDAs), or for a variety of information devices. Also, a variety of light emitting display devices having reduced weight and volume compared to cathode ray tube displays have been developed. For example, the organic light emitting display has superior light emission efficiency, brightness, viewing angle, and a fast response speed.

The organic light emitting display includes an organic light emitting panel having a plurality of pixels electrically connected between scan lines and data lines crossing the scan lines, a scan driver for driving the scan lines, and a data driver for driving the data lines. The scan driver sequentially provides scan signals to the organic light emitting panel via the scan lines. The data driver sequentially provides data signals to the organic light emitting panel via the data lines. The organic light emitting panel is electrically connected to the data lines and the scan lines and emits light in response to receiving the data signals and the scan signals.

A large organic light emitting panel has a resolution of full high definition (FHD) or higher and has an operating frequency of 120 Hz or higher. As a load of the scan line increases, RC delay of a signal transmitted on such scan line increases. Also, since the number of horizontal lines is large and scan frequency is fast, a scan time of a horizontal cycle (1 H) is shortened. In this case, when an abnormal scan signal is output, a normal data signal may not be input to a pixel. Also, when the scan time is shortened in a compensation pixel circuit, a compensation time is shortened accordingly so that normal compensation may not be performed which causes an irregular or degraded image.

Thus, when the organic light emitting panel having a resolution of FHD is driven at 120 Hz or higher, in order to prevent the generation of an abnormal scan signal due to the shortened scan time, the organic light emitting panel may be driven by increasing the pulse width of the scan signal.

SUMMARY

Embodiments of the present invention are directed toward a scan driver which may prevent or reduce generation of an abnormal scan signal and provide a regular image, and an organic light emitting display using the scan driver.

According to an embodiment of the present invention, a scan driver coupled to a plurality of scan lines includes a plurality of stages for sequentially receiving clock signals that are phase delayed from each other by two horizontal cycles or more from three clock lines of a plurality of clock lines, and outputting a plurality of scan signals each having a pulse width of two horizontal cycles or more to corresponding scan lines, wherein each of the scan siganls is output to a corresponding one of scan lines and the scan signals are overlapped with each other by one horizontal cycle or more.

The plurality of clock lines may include six clock lines, each of the stages may be configured to sequentially receive three clock signals that are phase delayed from each other by two horizontal cycles from three clock lines of the six clock lines and output a corresponding one of the scan signals having a pulse width of two horizontal cycles to a corresponding one of the scan lines, and the scan signals may be overlapped with each other by one horizontal cycle.

The plurality of clock lines may include nine clock lines, each of the stages may be configured to sequentially receive three clock signals that are phase delayed from each other by three horizontal cycles from three clock lines of the nine clock lines and output a corresponding one of the scan signals having a pulse width of three horizontal cycles to a corresponding one of the scan lines, and the scan signals may be overlapped with each other by two horizontal cycles.

The plurality of clock lines may sequentially provide a clock signal that is phase delayed by one horizontal cycle.

Each of the stages may include a sixth switching device including a gate electrode coupled to an input terminal to which a scan signal of a previous stage or a start signal is applied, a first electrode coupled to a first power source, and a second electrode coupled to a second node, a fifth switching device including a gate electrode coupled to a second clock terminal, a first electrode coupled to the input terminal, and a second electrode coupled to a first node, a fourth switching device including a gate electrode coupled to a first clock terminal, a first electrode coupled to the second node, and a second electrode coupled to the second power source, a third switching device including a gate electrode coupled to the second node, a first electrode coupled to the first power source, and a second electrode coupled to the first node, a second switching device including a gate electrode coupled to the first node, a first electrode coupled to an output terminal, and a second electrode coupled to a third clock terminal, and a first switching device including a gate electrode coupled to the second node, a first electrode coupled to the first power source, and a second electrode coupled to the output terminal.

The scan signal of the previous stage or the start signal may have a pulse width of two horizontal cycles or more.

The scan driver may further include a first capacitive device coupled between the first node and the output terminal and a second capacitive device coupled between the first power source and the second node.

According to another embodiment of the present invention, an organic light emitting display includes an organic light emitting panel including a plurality of pixels at crossing regions between a plurality of data lines and a plurality of scan lines, a data driver coupled to the plurality of data lines, and for applying a plurality of data signals to the plurality of data lines, and a scan driver including a plurality of stages respectively coupled to the plurality of scan lines, and each of the stages for sequentially receiving clock signals that are phase delayed by two horizontal cycles or more from three clock lines of a plurality of clock lines and outputting a scan signal having a pulse width of two horizontal cycles or more to a corresponding one of the scan lines, wherein the neighboring scan signals are overlapped with each other by one horizontal cycle or more.

BRIEF DESCRIPTION OF THE DRAWINGS

The above and other features and aspects of the present invention will become more apparent by describing in detail exemplary embodiments thereof with reference to the attached drawings in which.

DETAILED DESCRIPTION

Figure 1:
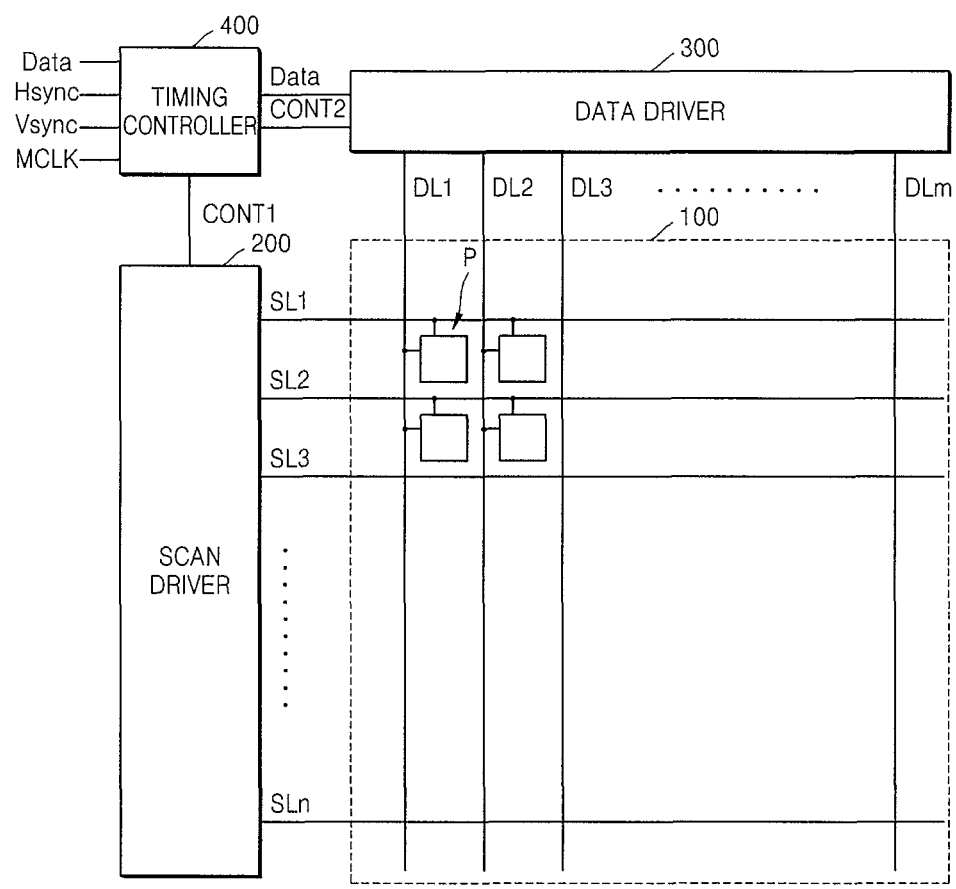
FIG. 1 is a circuit diagram schematically showing the structure of an organic light emitting display according to an embodiment of the present invention.

The attached drawings for illustrating exemplary embodiments of the present invention are referred to in order to gain a sufficient understanding of the present invention, the merits thereof, and the features and aspects of the present invention. Hereinafter, the present invention will be described in detail by explaining exemplary embodiments of the invention with reference to the attached drawings. Here, when a first element is described as being coupled or connected to a second element, the first element may be directly coupled to the second element or indirectly coupled to the second element via a third element. Like reference numerals in the drawings denote like elements.

FIG. 1 is a circuit diagram schematically showing the structure of an organic light emitting display according to an embodiment of the present invention. Referring to FIG. 1, the organic light emitting display includes an organic light emitting panel 100, a scan driver 200, a data driver 300, and a timing controller 400.

The organic light emitting panel 100 includes a plurality of scan lines SL1-SLn, a plurality of data lines DL1-DLm, and a plurality of pixels P. The scan lines SL1-SLn are arranged in rows that are spaced from one another, and each scan line transmits a scan signal. The data lines DL1-DLm are arranged in columns that are spaced from one another, and each data line transmits a data signal. The scan lines SL1-SLn and the data lines DL1-DLm form a matrix. A pixel P is formed at a crossing region between the scan line and the data line. When the pixel P is a current-write pixel, the data signal is represented by current. When the pixel P is a voltage-write pixel, the data signal is represented by voltage.

To represent color, each pixel displays one of primary colors, or each pixel alternately displays the primary colors, thereby representing a desired color by displaying the corresponding primary colors at the same time (sum-over-space) or time-multiplexed (sum-over-time). The primary colors may be, for example, red (R), green (G), and blue (B). When a color is displayed by the sum-over-time approach, the R, G, and B colors for representing the desired color are alternately displayed in one pixel in terms of time. When a color is displayed by the sum-over-space approach, since the color is implemented by three pixels of an R pixel, a G pixel, and a B pixel, each color is referred to as a sub-pixel, and three sub-pixels may be referred to as one pixel. Also, when a color is displayed by the sum-over-space approach, the R pixel, the G pixel, and the B pixel may be alternately arranged in a direction along a row or a column, or at positions corresponding to three apexes of a triangle.

The scan driver 200 is connected to the scan lines SL1-SLn of the organic light emitting panel 100 and applies to the scan lines SL1-SLn a scan signal formed of a combination of a gate-on voltage and a gate-off voltage. The scan driver 200 may apply a scan signal such that a plurality of selection signals respectively applied to the scan lines SL1-SLn sequentially have a gate-on voltage. When the scan signal having a gate-on voltage is applied to a scan line, a switching transistor connected to the scan line is turned on.

The scan driver 200 includes a plurality of stages, each working as a shift register. Each stage receives clock signals that are phase delayed from each other by two horizontal cycles or more from three clock lines, respectively, of a plurality of clock lines and outputs a scan signal having a pulse width of two horizontal cycles or more to a corresponding scan line. The scan signals of neighboring scan lines may be overlapped by one horizontal cycle or more. The clock lines sequentially supply clock signals that are phase delayed by one horizontal cycle.

The data driver 300 is connected to the data lines DL1-DLm of the organic light emitting panel 100 and applies data signals indicating gradations (e.g., gray levels) to the data lines DL1-DLm. The data driver 300 converts input image data Data having a gradation, which is input from the timing controller 400, into a data signal in the form of a voltage or current.

The timing controller 400 receives the input image data Data and an input control signal for controlling the display of the input image data Data from an external graphic controller. The input control signal includes, for example, a horizontal sync signal Hsync, a vertical sync signal Vsync, and a main clock MCLK. The timing controller 400 transfers the input image data Data to the data driver 300, generates a scan control signal CONT1 and a data control signal CONT2, and transfers the generated scan control signal CONT1 and data control signal CONT2, respectively, to the scan driver 200 and the data driver 300. The scan control signal CONT1 includes a scan start signal SSP indicating the start of scanning and a plurality of clock signals SCLK. The data control signal CONT2 includes a clock signal and a horizontal sync start signal STH indicating the transfer of the input image data Data with respect to a pixel of a column.

When transferring the input image data Data corresponding to a column to the data driver 300, the timing controller 400 may transfer the input image data Data by color through three channels, or in order (or sequentially) through one channel.

Figure 2:
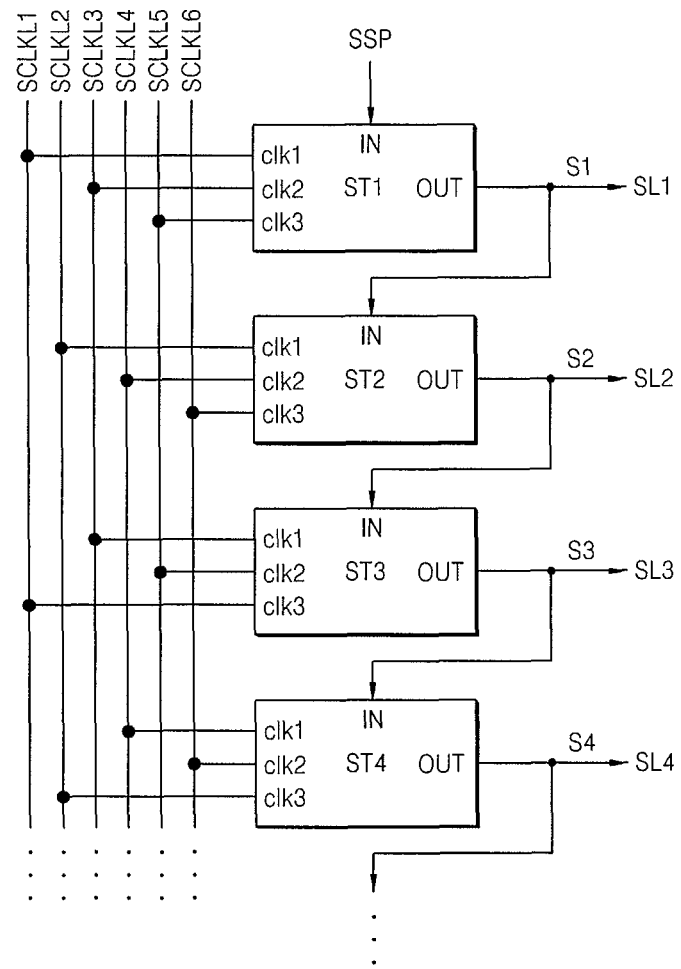
FIG. 2 is a schematic block diagram of a scan driver according to an embodiment of the present invention.
Figure 3:
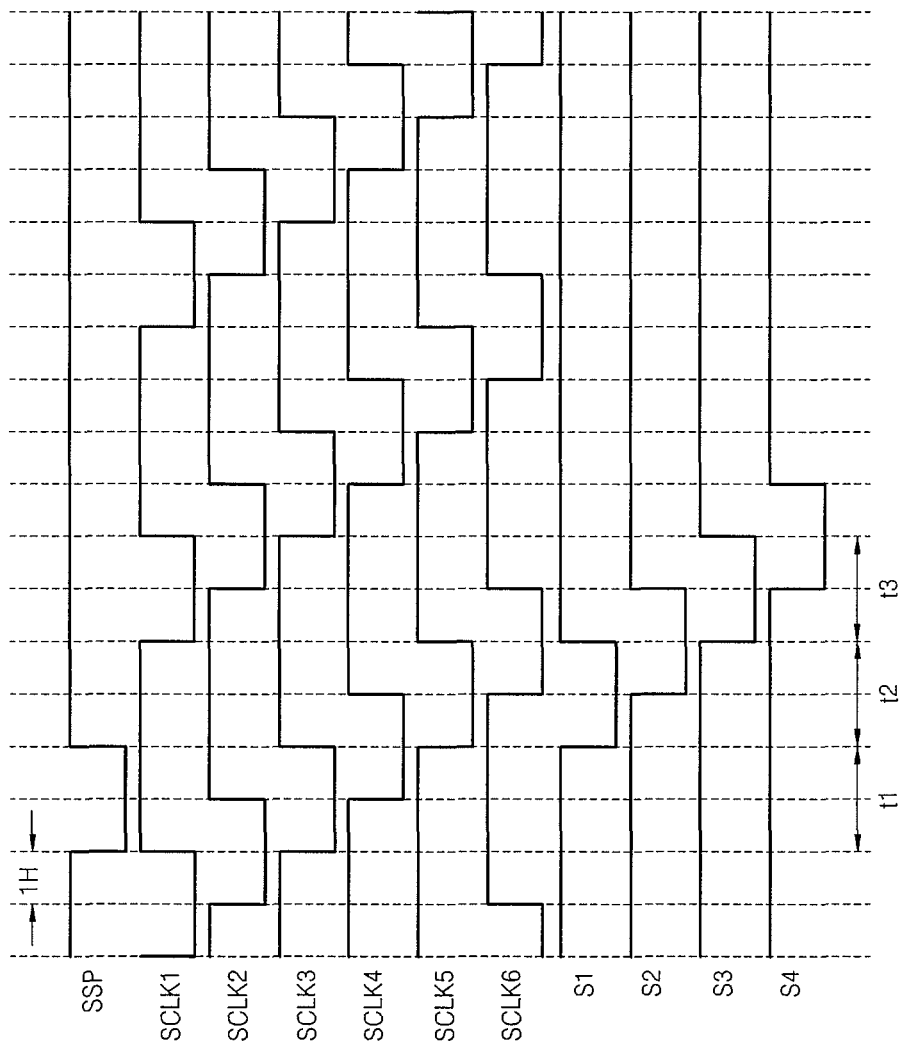
FIG. 3 is a timing diagram showing the operation of the scan driver of FIG. 2.

FIG. 2 is a schematic block diagram of a scan driver according to an embodiment of the present invention. FIG. 3 is a timing diagram showing the operation of the scan driver of FIG. 2.

Referring to FIGS. 2 and 3, the scan driver includes n number of stages ST1-STn respectively connected to a scan start signal (SSP) line and three clock lines of six-phase clock lines SCLKL1-SCLKL6. The clock signals SCLK1-SCLK6 of the six-phase clock lines SCLKL1-SCLKL6 are phase delayed by one horizontal cycle 1 H. Both of the scan start signal SSP and the clock signals SCLK1-SCLK6 are applied for two horizontal cycles 2 H and thus have a pulse width of 2 H. For the convenience of explanation, FIGS. 2 and 3 illustrate only first through fourth stages ST1-ST4 and a timing diagram thereof.

Each of the scan signals S1-Sn output from an output terminal OUT of each stage is provided to a corresponding one of the scan lines SL1-SLn, and concurrently (e.g., simultaneously) provided to an input terminal IN of a next stage as a start signal of the next stage. Here, the scan start signal SSP is input at the input terminal IN of the first stage ST1, and the output signal of a previous stage, e.g., the scan signals S1 to Sn-1, are input at the second through n-th stages ST2-STn.

At the first stage ST1, a first clock terminal clk1, a second clock terminal clk2, and a third clock terminal clk3 are electrically and respectively connected to the first clock line SCLKL1, the third clock line SCLKL3, and the fifth clock line SCLKL5. Also, the scan start signal SSP is input to the input terminal IN of the first stage STI, and a first scan signal S1 having a pulse width of 2 H is output from the output terminal OUT of the first stage ST1 toward the first scan line SL1.

At the second stage ST2, the first clock terminal clk1, the second clock terminal clk2, and the third clock terminal clk3 are electrically and respectively connected to the second clock line SCLKL2, the fourth clock line SCLKL4, and the sixth clock line SCLKL6. Also, the first scan signal S1 is input to the input terminal IN of the second stage ST2, and a second scan signal S2 having a pulse width of 2 H is output from the output terminal OUT of the second stage ST2 toward the second scan line SL2.

At the third stage ST3, the first clock terminal clk1, the second clock terminal clk2, and the third clock terminal clk3 are electrically and respectively connected to the third clock line SCLKL3, the fifth clock line SCLKL5, and the first clock line SCLKL1. Also, the second scan signal S2 is input to the input terminal IN of the third stage ST3, and a third scan signal S3 having a pulse width of 2 H is output from the output terminal OUT of the third stage ST3 toward the third scan line SL3.

Similarly, at the fourth through n-th stages ST4-STn, by using three clock signals that are phase delayed by 2 H of the clock signals SCLK1-SCLK6 of the first through sixth clock lines SCLKL1-SCLKL6, scan signals S3 to Sn-1 are input to the input terminal IN, and the scan signals S4-Sn having a pulse width of 2 H are output from the output terminal OUT toward the scan lines SL4-SLn.

Since the scan driver of FIG. 2 uses first through sixth clock signals SCLK1-SCLK6, the clock signal is repeated every six stages. The scan signals S1-Sn provided to the scan lines SL1-SLn have a scan time of 2 H, which is a scan pulse duration time. The scan signals S1-Sn output from the neighboring stages are overlapped with each other by 1 H. The process of generating a scan signal in first through third sections t1-t3 will be described later in more detail.

Figure 4:
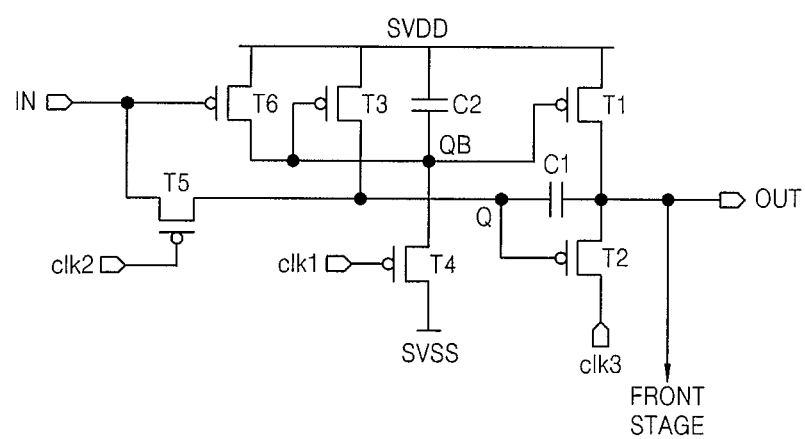
FIG. 4 is a detailed circuit diagram of a stage in the scan driver of FIG. 2.

FIG. 4 is a detailed circuit diagram of a stage STi in the scan driver of FIG. 2 according to an embodiment of the present invention. In the following description, the first stage ST1 is discussed as an example, and the structure and operation of the first stage ST1 may be equally applied to the other stages.

Referring to FIG. 4, the first stage ST1 includes a first switching device T1, a second switching device T2, a third switching device T3, a fourth switching device T4, a fifth switching device T5, a sixth switching device T6, a first capacitive device C1 (e.g., a capacitor), and a second capacitive device C2 (e.g., a capacitor). A first power voltage SVDD is a high-level signal provided by a first external power source. A second power voltage SVSS is a low-level signal provided by a second external power source.

Referring to the sixth switching device T6, a first electrode (e.g., a drain electrode or a source electrode) is electrically connected to the input terminal IN, and a second electrode (e.g., the source electrode or the drain electrode) is electrically connected to a second node QB. When a low-level signal is applied to the gate electrode, the sixth switching device T6 is turned on to apply the first power voltage SVDD to the second node QB.

Referring to the fifth switching device T5, a first electrode is electrically connected to the input terminal IN, a second electrode is electrically connected to a first node Q, and a gate electrode is electrically connected to the second clock terminal clk2. When a low-level signal is applied to the gate electrode, the fifth switching device T5 is turned on to supply the voltage of the input terminal IN to the first node Q.

Referring to the fourth switching device T4, a first electrode is electrically connected to the second node QB, a second electrode is electrically connected to the second power source SVSS, and a gate electrode is electrically connected to the first clock terminal clk1. When a low-level signal is applied to the gate electrode, the fourth switching device T4 is turned on to apply the second power voltage SVSS to the second node QB.

Referring to the third switching device T3, a first electrode is electrically connected to the first power source SVDD, a second electrode is electrically connected to the first node Q, and a gate electrode is electrically connected to the second node QB. When a low-level signal is applied to the gate electrode, the third switching device T3 is turned on to apply the first power voltage SVDD to the first node Q.

Referring to the second switching device T2, a gate electrode is electrically connected to the first node Q, a first electrode is electrically connected to the output terminal OUT, and a second electrode is electrically connected to the third clock terminal clk3. When a low-level signal is applied to the gate electrode, the second switching device T2 is turned on to supply the voltage of the clock signal input from the third clock terminal clk3 to the output terminal OUT.

Referring to the first switching device T1, a gate electrode is electrically connected to the second node QB, a first electrode is electrically connected to the first power source SVDD, and a second electrode is electrically connected to the output terminal OUT. When a low-level signal is applied to the gate electrode, the first switching device T1 is turned on to supply the first power voltage SVDD to the output terminal OUT.

Referring to the first capacitive device C1, a first electrode is electrically connected to the first node Q, and a second electrode is electrically connected to the output terminal OUT. The first capacitive device C1 stores a voltage difference between the first node Q and a node to which the output terminal OUT, the second electrode of the first switching device T1, and the first electrode of the second switching device T2 are electrically connected.

Referring to the second capacitive device C2, a first electrode is electrically connected to the first power source SVDD, and a second electrode is electrically connected to the second node QB. The second capacitive device C2 stores a voltage difference between the first and second electrodes.

The second electrode of the fifth switching device T5, the second electrode of the third switching device T3, and the gate electrode of the second switching device T2 are connected to the first node Q. The second electrode of the sixth switching device T6, the first electrode of the fourth switching device T4, the gate electrode of the third switching device T3, and the gate electrode of the first switching device T1 are connected to the second node QB.

Although in the above-described embodiment of the present invention the switching devices T1-T6 are all implemented by PMOS transistors, the driving method of the present invention may be available by using NMOS transistors for the switching devices T1-T6 and inverting the signals.

Figure 5:
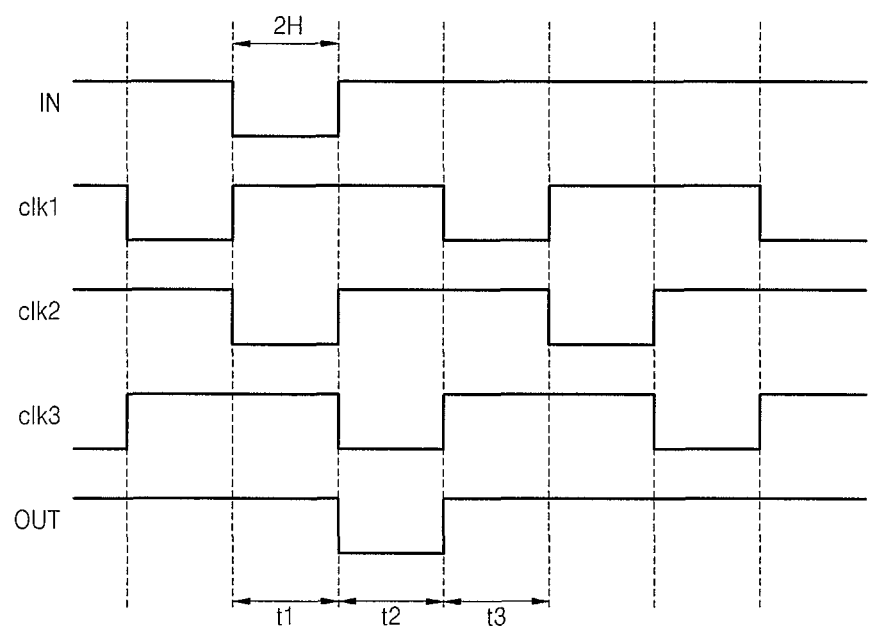
FIG. 5 is a timing diagram showing the operation of the stage of FIG. 4.

FIG. 5 is a timing diagram showing the operation of a stage STi of FIG. 4. Referring to FIGS. 4 and 5, each of the start signal input to the input terminal IN, the clock signals of the first through third clock terminals clk1-clk3, and the scan signal output from the output terminal OUT has a pulse width of 2 H. The clock signals input to the first through third clock terminals clk1-clk3 are phase delayed by 2 H. The scan signal is output by being shifted by 2 H from the start signal.

In the first section t1, the scan signal of the previous stage or the start signal SSP is applied to the gate electrode of the sixth switching device T6 and concurrently (e.g., simultaneously) to the first electrode of the fifth switching device T5. Also, the low-level clock signal is applied to the fifth switching device T5 via the second clock terminal clk2. A high-level clock signal is applied to each of the first and third clock terminals clk1 and clk3.

In this case, the sixth switching device T6 is turned on by the low-level start signal SSP, and thus the high-level first power voltage SVDD is applied to the second node QB. The fifth switching device T5 is turned on by the low-level second clock signal applied to the second clock terminal clk2. The first node Q is pre-charged to a voltage equal to the sum (SVSS+|Vth|) of the low-level second power voltage SVSS and the threshold voltage |Vth|. The second switching device T2 is turned on by the voltage of the first node Q.

As the high-level first power voltage SVDD is applied to the second node QB, the first switching device T1 and the third switching device T3 are turned off. Thus, a high-level clock signal is applied to the second electrode of the second switching device T2 via the third clock terminal clk3 so that a high-level scan signal is output from the output terminal OUT connected to the first electrode of the second switching device T2.

That is, the scan signal output through the scan line in the first section t1 has a high level. Also, the first capacitive device C1 connected between the first node Q and the output terminal OUT stores a voltage equal to the potential difference between the first node Q and the output terminal OUT during the first section t1.

In the second section t2, the levels of the scan signal of the previous stage or the start signal SSP and the clock signal of the second clock terminal clk2 are inverted to high levels, and the level of the clock signal of the third clock terminal clk3 is inverted to a low level. The clock signal of the first clock terminal clk1 maintains a high level. In this case, the other switching devices, except for the second switching device T2 are all turned off by the high-level start signal SSP and the clock signals of the first and second clock terminals clk1 and clk2.

The voltage of the output terminal (OUT) node is dropped toward the second power voltage SVSS by the second switching device T2. As the voltage stored at the first capacitive device C1 is discharged, bootstrapping is generated. Accordingly, the voltage of the first node Q is dropped to a voltage much lower than the second power voltage SVSS so that the second switching device T2 is completely turned on.

Thus, a low-level clock signal is applied to the second electrode of the second switching device T2 via the third clock terminal clk3. A low-level scan signal is output from the output terminal OUT connected to the first electrode of the second switching device T2. That is, the signal output through the scan line in the second section t2 has a low level.

In the third section t3, the level of the clock signal of the third clock terminal clk3 is inverted to a high level, and the level of the clock signal of the first clock terminal clk1 is inverted to a low level. The start signal SSP and the clock signal of the second clock terminal clk2 maintain high levels.

In this case, the fourth switching device T4 is turned on by the low-level clock signal of the first clock terminal clk1, and thus the low-level second power voltage SVSS is applied to the second node QB. As the low-level second power voltage SVSS is applied to the second node QB, the first and third switch devices T1 and T3 are turned on. Thus, the high-level first power voltage SVDD at the first electrode of the first switching device T1 is output from the output terminal OUT connected to the second electrode of the first switching device T1 as a high-level scan signal. Also, as the third switching device T3 is turned on, the first power voltage SVDD is applied to the first node Q, and thus the second switching device T2 is turned off.

That is, the scan signal output through the scan line in the third section t3 has a high level. The second capacitive device C2 is connected between a source for supplying the first power voltage SVDD and the second node QB to decrease a change in the voltage applied to the first power voltage SVDD and the second node QB.

The shift register operation between the neighboring stages in the second section t2 will be described, with reference to FIGS. 3-5, with an example of the scan signals S1 and S2 that are respectively output to the first scan line SL1 and the second scan line SL2 from the first stage ST1 and the second stage ST2.

At the first stage ST1, the first clock signal SCLK1, the third clock signal SCLK3, and the fifth clock signal SCLK5 are respectively input to the first clock terminal clk1, the second clock terminal clk2, and the third clock terminal clk3. At the second stage ST2, the second clock signal SCLK2, the fourth clock signal SCLK4, and the sixth clock signal SCLK6 are respectively input to the first clock terminal clk1, the second clock terminal clk2, and the third clock terminal clk3.

In the second section t2, at the first stage ST1, the levels of the start signal SSP and the third clock signal SCLK3 are inverted to high levels, and the level of the fifth clock signal SCLK5 is inverted to a low level. The first clock signal SCLK1 maintains a high level. In this case, the other switching devices, except for the second switching device T2, are all turned off by the high-level start signal SSP and the first and third clock signals SCLK1 and SCLK3. Since the voltage of the first node Q is dropped to a voltage that is much lower than the second power voltage SVSS due to the bootstrapping by the first capacitive device C1, the second switching device T2 is completely turned on. Thus, the low-level fifth clock signal SCLK5 is applied to the second electrode of the second switching device T2 via the third clock terminal clk3. A low-level scan signal is output from the output terminal OUT connected to the first electrode of the second switching device T2.

During the first half 1 H of the second section t2, at the second stage ST2, as the low-level fourth clock signal SCLK4 is applied, the fifth switching device T5 is turned on so that the first node Q is pre-charged to the low-level second power voltage SVSS. Accordingly, the second switching device T2 is turned on, and the high-level sixth clock signal SCLK6 is applied through the second switching device T2 so that a high-level scan signal is output from the output terminal OUT. Next, during the latter half 1 H of the second section t2, at the second stage ST2, since the voltage of the first node Q is dropped to a voltage that is much lower than the second power voltage due to the bootstrapping by the first capacitive device C1, the second switching device T2 is turned on. Accordingly, the low-level sixth clock signal SCLK6 is applied via the second switching device T2, a low-level scan signal is output from the output terminal OUT. Thus, the continuous shift register operation is performed between the first and second stages ST1 and ST2, which will be equally applied to the other stages.

Figure 6:
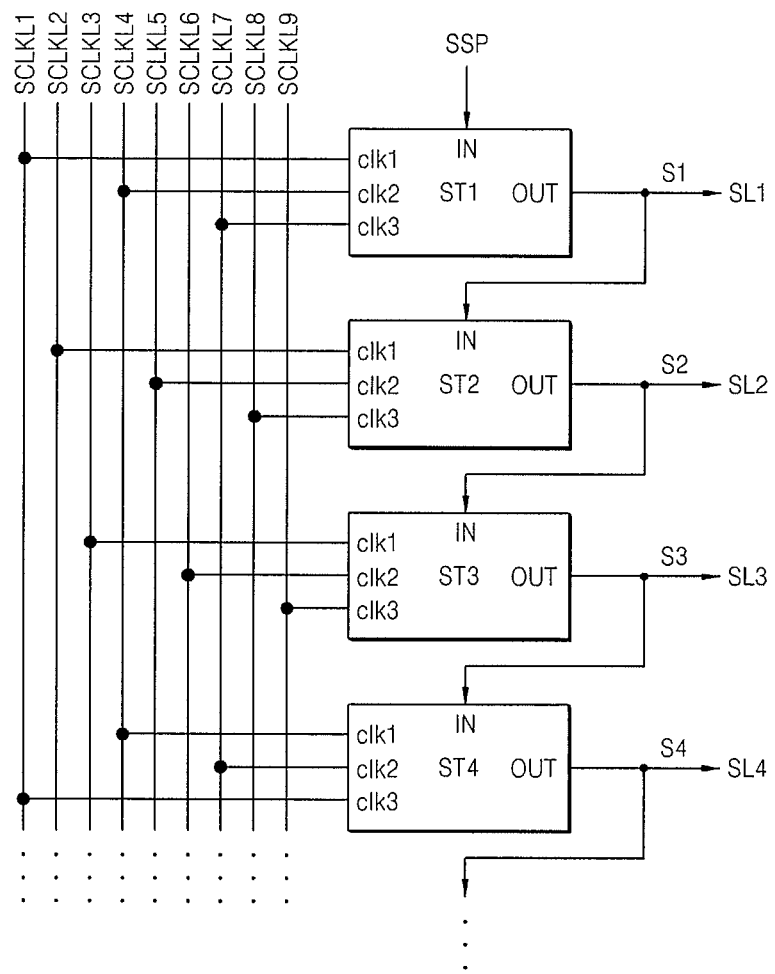
FIG. 6 is a schematic block diagram of a scan driver according to another embodiment of the present invention.
Figure 7:
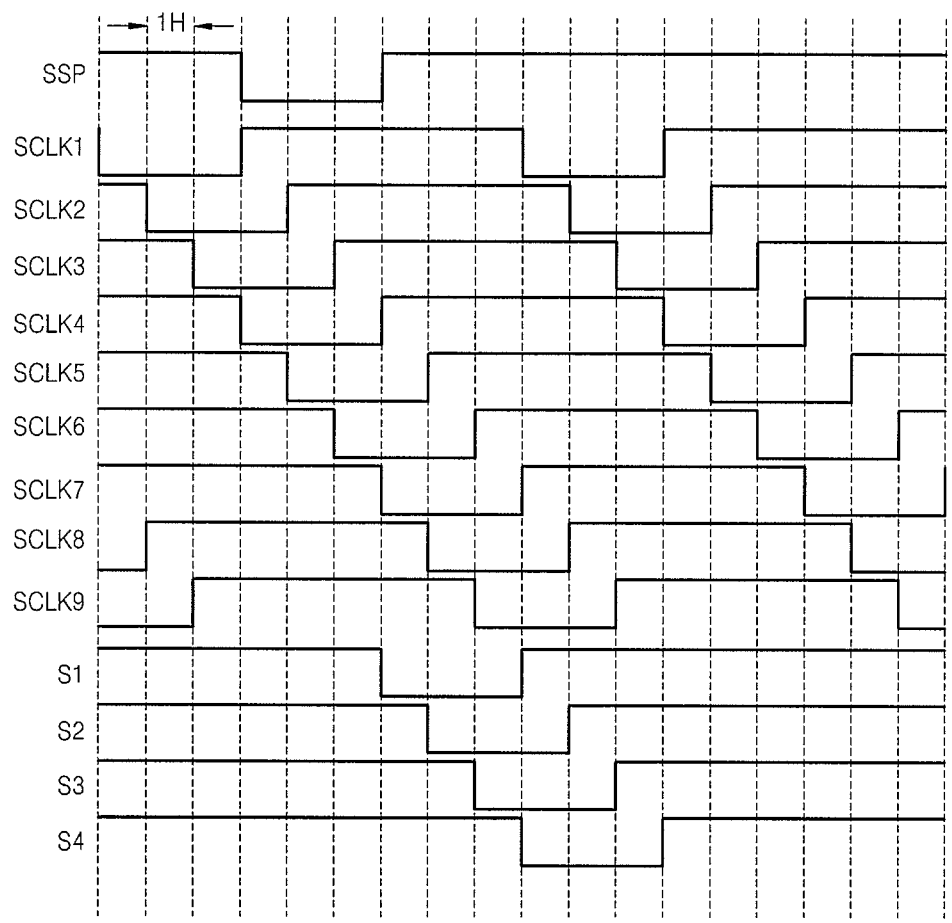
FIG. 7 is a timing diagram showing the operation of the scan driver of FIG. 6.

FIG. 6 is a schematic block diagram of a scan driver according to another embodiment of the present invention. FIG. 7 is a timing diagram showing the operation of the scan driver of FIG. 6.

Referring to FIGS. 6 and 7, the scan driver includes n number of stages ST1-STn respectively connected to the scan start signal (SSP) line and three clock lines of nine-phase clock lines SCLKL1-SCLKL9. The clock signals SCLK1-SCLK9 of the nine-phase clock lines SCLKL1-SCLKL9 are phase delayed by one horizontal cycle 1 H. Both of the scan start signal SSP and the clock signals SCLK1-SCLK9 are applied for three horizontal cycles 3 H and thus have a pulse width of 3 H. For the convenience of explanation, FIGS. 6 and 7 illustrate only first through fourth stages ST1-ST4 and a timing diagram thereof.

Each of the scan signals S1-Sn output from the output terminal OUT of each stage is provided to a corresponding one of the scan lines SL1-SLn, and concurrently (e.g., simultaneously) provided to the input terminal IN of a next stage as a start signal of the next stage. The scan start signal SSP is input at the input terminal IN of the first stage ST1, and the output signal of a previous stage, e.g., the scan signals S1 to Sn-1, are input at input terminals IN of the second through n-th stages ST2-STn.

At the first stage ST1, the first clock terminal clk1, the second clock terminal clk2, and the third clock terminal clk3 are electrically and respectively connected to the first clock line SCLKL1, the fourth clock line SCLKL4, and the seventh clock line SCLKL7. Also, the scan start signal SSP is input to the input terminal IN, and a first scan signal S1 having a pulse width of 3 H is output from the output terminal OUT toward the first scan line SL1.

At the second stage ST2, the first clock terminal clk1, the second clock terminal clk2, and the third clock terminal clk3 are electrically and respectively connected to the second clock line SCLKL2, the fifth clock line SCLKL5, and the eighth clock line SCLKL8. Also, the first scan signal S1 is input to the input terminal IN, and a second scan signal S2 having a pulse width of 3 H is output from the output terminal OUT toward the second scan line SL2.

At the third stage ST3, the first clock terminal clk1, the second clock terminal clk2, and the third clock terminal clk3 are electrically and respectively connected to the third clock line SCLKL3, the sixth clock line SCLKL6, and the ninth clock line SCLKL9. Also, the second scan signal S2 is input to the input terminal IN, and a third scan signal S3 having a pulse width of 3 H is output from the output terminal OUT toward the third scan line SL3.

Similarly, at the fourth through n-th stages ST4-STn, by using three clock signals that are phase delayed by 3 H of the clock signals SCLK1-SCLK9 of the first through ninth clock lines SCLKL1-SCLKL9, previous scan signals S3 to Sn-1 are input to the input terminals INs, and the scan signals S4-Sn having a pulse width of 3 H are output from the output terminals OUTs toward the scan lines SL4-SLn.

Since the scan driver of FIG. 6 uses first through ninth clock signals SCLK1-SCLK9, the clock signal is repeated every nine stages. The scan signals S1-Sn provided to the scan lines SL1-SLn have a scan time of 3 H that is a scan pulse duration time. The scan signals S1-Sn output from the neighboring stages are overlapped with each other by 2 H.

The driving circuit of FIG. 4 may be equally applied to the driving circuit of each stage of FIG. 6. Accordingly, since the operation timing diagrams of the respective stages are the same as those illustrated in FIG. 5, except for the pulse with 3 H of each signal and the driving methods are identical, detailed descriptions thereof will be omitted herein.

In the embodiments of the present invention, by adjusting the pulse width and delay time of the clock signal applied to each stage, the pulse width of a scan signal becomes 2 H or higher and the overlap section of 1 H or 2 H may be provided between the scan signals of the neighboring stages. Thus, during the driving of an organic light emitting panel of FHD at 120 Hz or higher, generation of an abnormal scan signal due to a shortened scan time may be prevented or reduced, hence a uniform image may be provided.

As described above, according to embodiments of the present invention, since the scan driver is driven by increasing the pulse width of a scan signal by two horizontal (2 H) cycles or more, the generation of an abnormal scan signal due to the shortened scan time may be prevented or reduced, hence a uniform image may be provided during the driving of an organic light emitting panel of FHD at 120 Hz or higher.

While this invention has been particularly shown and described with reference to exemplary embodiments thereof, it will be understood by those skilled in the art that various changes in form and details may be made therein without departing from the spirit and scope of the invention as defined by the appended claims, and equivalents thereof.

What is claimed is:

1. A scan driver coupled to a plurality of scan lines, comprising a plurality of stages, each of the plurality of stages for sequentially receiving clock signals that are non-overlapping and are phase delayed from each other by two horizontal cycles or more from three of a plurality of clock lines, the plurality of stages being configured to output a plurality of scan signals each having a pulse width of two horizontal cycles or more to corresponding scan lines, wherein each of the scan signals is output to a corresponding one of the scan lines and neighboring scan signals are overlapped with each other by one horizontal cycle or more,
wherein the plurality of clock lines sequentially provide the clock signals, consecutives ones of the clock signals being phase delayed by one horizontal cycle.

2. The scan driver of claim 1, wherein each of the stages is configured to sequentially receive three clock signals that are phase delayed from each other by two horizontal cycles from three of the plurality of clock lines and output a corresponding one of the scan signals having a pulse width of two horizontal cycles to a corresponding one of the scan lines, and the scan signals are overlapped with each other by one horizontal cycle.

3. The scan driver of claim 1, wherein the plurality of clock lines comprises nine clock lines, each of the stages is configured to sequentially receive three clock signals that are phase delayed from each other by three horizontal cycles from three clock lines of the nine clock lines and output a corresponding one of the scan signals having a pulse width of three horizontal cycles to a corresponding one of the scan lines, and the scan signals are overlapped with each other by two horizontal cycles.

4. The scan driver of claim 1, wherein each of the stages comprises:
a sixth switching device comprising a gate electrode coupled to an input terminal to which a scan signal of a previous stage or a start signal is applied, a first electrode coupled to a first power source, and a second electrode coupled to a second node;

a fifth switching device comprising a gate electrode coupled to a second clock terminal, a first electrode coupled to the input terminal, and a second electrode coupled to a first node;

a fourth switching device comprising a gate electrode coupled to a first clock terminal, a first electrode coupled to the second node, and a second electrode coupled to a second power source;

a third switching device comprising a gate electrode coupled to the second node, a first electrode coupled to the first power source, and a second electrode coupled to the first node;

a second switching device comprising a gate electrode coupled to the first node, a first electrode coupled to an output terminal, and a second electrode coupled to a third clock terminal; and a first switching device comprising a gate electrode coupled to the second node, a first electrode coupled to the first power source, and a second electrode coupled to the output terminal.

5. The scan driver of claim 4, wherein the scan signal of the previous stage or the start signal has a pulse width of two horizontal cycles or more.

6. The scan driver of claim 4, farther comprising a first capacitive device coupled between the first node and the output terminal and a second capacitive device coupled between the first power source and the second node.

7. The scan driver of claim 4, wherein the first to sixth switching devices comprise PMOS transistors.

8. An organic light emitting display comprising:
an organic light emitting panel including a plurality of pixels at crossing regions between a plurality of data lines and a plurality of scan lines;
a data driver coupled to the plurality of data lines, and for applying a plurality of data signals to the plurality of data lines; and
a scan driver comprising a plurality of stages respectively coupled to the plurality of scan lines, each of the stages for sequentially receiving clock signals that are non-overlapping and are phase delayed from each other by two horizontal cycles or more from three of a plurality of clock lines and outputting a scan signal having a pulse width of two horizontal cycles or more to a corresponding one of the scan lines, wherein neighboring scan signals are overlapped with each other by one horizontal cycle or more,
wherein the plurality of clock lines sequentially provide the clock signals, consecutives ones of the clock signals being phase delayed by one horizontal cycle.

9. The organic light emitting display of claim 8, wherein each of the stages is configured to sequentially receive three clock signals that are phase delayed by two horizontal cycles from three of the plurality of clock lines and output the scan signal having a pulse width of two horizontal cycles to a corresponding one of the scan lines, and the scan signals are overlapped with each other by one horizontal cycle.

10. The organic light emitting display of claim 8, wherein the plurality of clock lines comprise nine clock lines, each of the stages is configured to sequentially receive three clock signals that are phase delayed by three horizontal cycles from three of the plurality of clock lines of the nine clock lines and output the scan signal having a pulse width of three horizontal cycles to a corresponding one of the scan lines, and the scan signals are overlapped with each other by two horizontal cycles.

11. The organic light emitting display of claim 8, wherein the plurality of stages are for sequentially outputting the scan signals, and each of the stages comprises:
a sixth switching device comprising a gate electrode coupled to an input terminal to which a scan signal of a previous stage or a start signal is applied, a first electrode coupled to a first power source, and a second electrode coupled to a second node;

a fifth switching device comprising a gate electrode coupled to a second clock terminal, a first electrode coupled to the input terminal, and a second electrode coupled to a first node;

a fourth switching device comprising a gate electrode coupled to a first clock terminal, a first electrode coupled to the second node, and a second electrode coupled to a second power source;

a third switching device comprising a gate electrode coupled to the second node, a first electrode coupled to the first power source, and a second electrode coupled to the first node;

a second switching device comprising a gate electrode coupled to the first node, a first electrode coupled to an output terminal, and a second electrode coupled to a third clock terminal; and a first switching device comprising a gate electrode coupled to the second node, a first electrode coupled to the first power source, and a second electrode coupled to the output terminal.

12. The organic light emitting display of claim 11, wherein the scan signal of the previous stage or the start signal has a pulse width of two horizontal cycles or more.

13. The organic light emitting display of claim 11, further comprising a first capacitive device coupled between the first node and the output terminal and a second capacitive device coupled between the first power source and the second node.

* * * * *